US009953977B1

(12) United States Patent
Cheng et al.

(10) Patent No.: US 9,953,977 B1
(45) Date of Patent: Apr. 24, 2018

(54) FINFET SEMICONDUCTOR DEVICE

(71) Applicant: INTERNATIONAL BUSINESS MACHINES CORPORATION, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/486,432

(22) Filed: Apr. 13, 2017

(51) Int. Cl.
H01L 21/8234 (2006.01)
H01L 27/088 (2006.01)
H01L 29/66 (2006.01)
H01L 21/02 (2006.01)
H01L 21/311 (2006.01)
H01L 29/51 (2006.01)

(52) U.S. Cl.
CPC ...... *H01L 27/0886* (2013.01); *H01L 21/0228* (2013.01); *H01L 21/31116* (2013.01); *H01L 21/823431* (2013.01); *H01L 21/823481* (2013.01); *H01L 29/517* (2013.01); *H01L 29/6653* (2013.01); *H01L 29/66545* (2013.01)

(58) Field of Classification Search
CPC ..... H01L 21/823821; H01L 21/823431; H01L 21/845; H01L 29/66795; H01L 29/41791; H01L 27/1211; H01L 27/0886; H01L 27/0924; H01L 27/108
See application file for complete search history.

(56) References Cited

U.S. PATENT DOCUMENTS

| 5,994,726 | A | 11/1999 | Ikeda et al. |
| 9,196,475 | B2 | 11/2015 | Lee et al. |
| 2016/0049516 | A1* | 2/2016 | Huang ............... H01L 29/7853 257/401 |
| 2017/0005195 | A1* | 1/2017 | Ching ............... H01L 29/7848 |
| 2017/0084721 | A1* | 3/2017 | Hung ............... H01L 29/66795 |
| 2017/0104062 | A1* | 4/2017 | Bi ..................... H01L 29/66545 |

(Continued)

FOREIGN PATENT DOCUMENTS

| CN | 102664188 A | 5/2012 |
| CN | 102664188 B | 5/2012 |
| JP | 07142730 A | 6/1995 |

(Continued)

OTHER PUBLICATIONS

Haensch, W., "Silicon CMOS devices beyond scaling", IBM Journal of Research & Development, Jul./Sep. 2006, pp. 339-361, vol. 50—No. 4/5, Published Online Oct. 3, 2006. <https://pdfs.semanticscholar.org/e500/47669272579e6571e36119b92dffcc3ff1c3.pdf/>.

*Primary Examiner* — Christine Enad
(74) *Attorney, Agent, or Firm* — David Quinn

(57) ABSTRACT

Fabricating a semiconductor structure, including: forming a fin structure on a substrate by: forming a first fin layer on the substrate; forming a first insulator layer on the first fin layer; forming a second fin layer on the first insulator layer; forming a second insulator layer on the second fin layer; forming a third fin layer on the second insulator layer; and forming a gate structure on a plurality of opposing sides and a top surface of the fin structure.

3 Claims, 10 Drawing Sheets

(56) References Cited

U.S. PATENT DOCUMENTS

2017/0133377 A1* 5/2017 Glass .................. H01L 27/0924
2017/0162695 A1* 6/2017 Ching ................. H01L 29/7848

FOREIGN PATENT DOCUMENTS

| JP | 3146045 B2 | 3/2001 |
| KR | 1020130141379 A | 12/2013 |
| WO | 2015175834 A1 | 11/2015 |

* cited by examiner

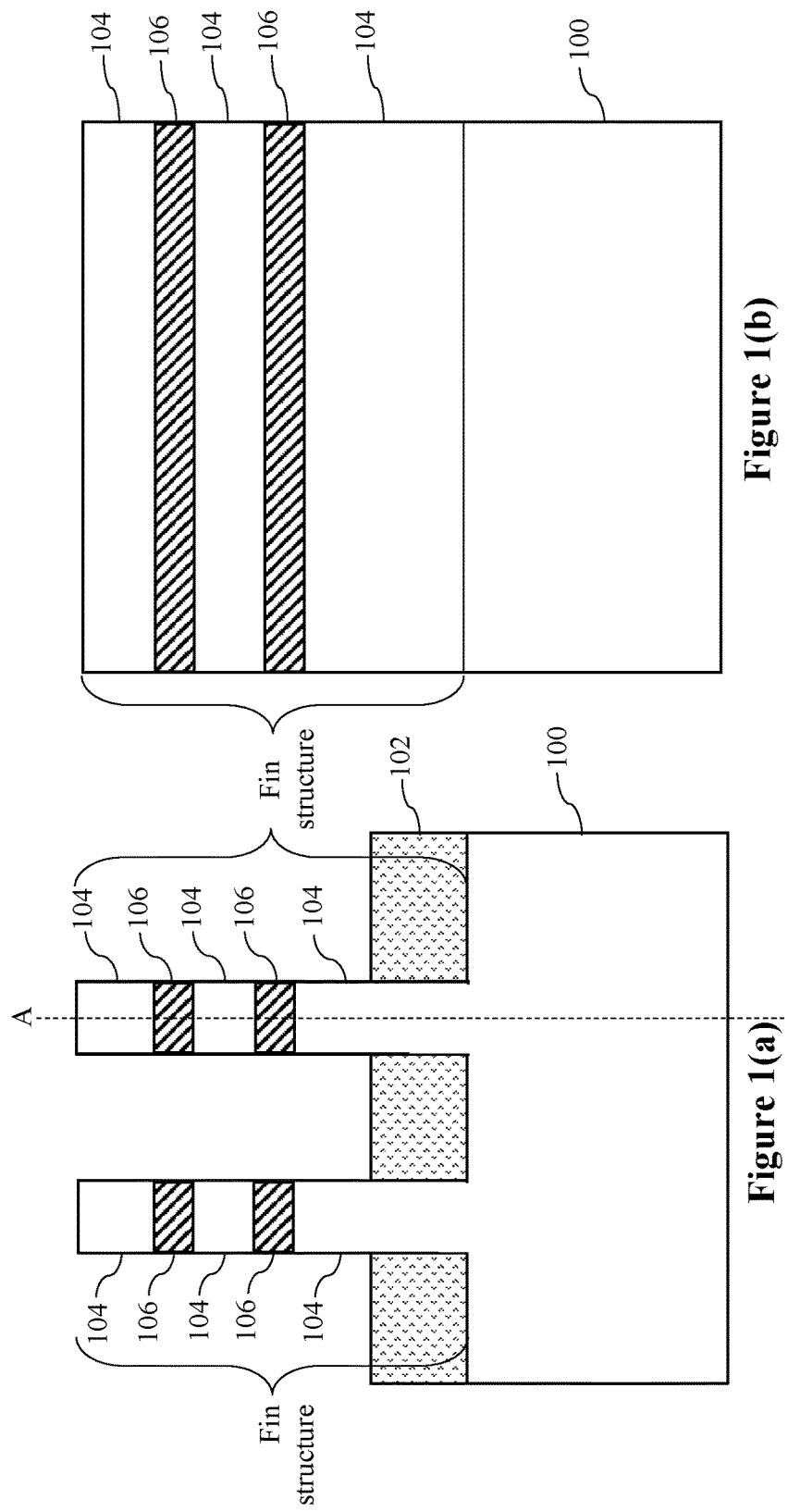

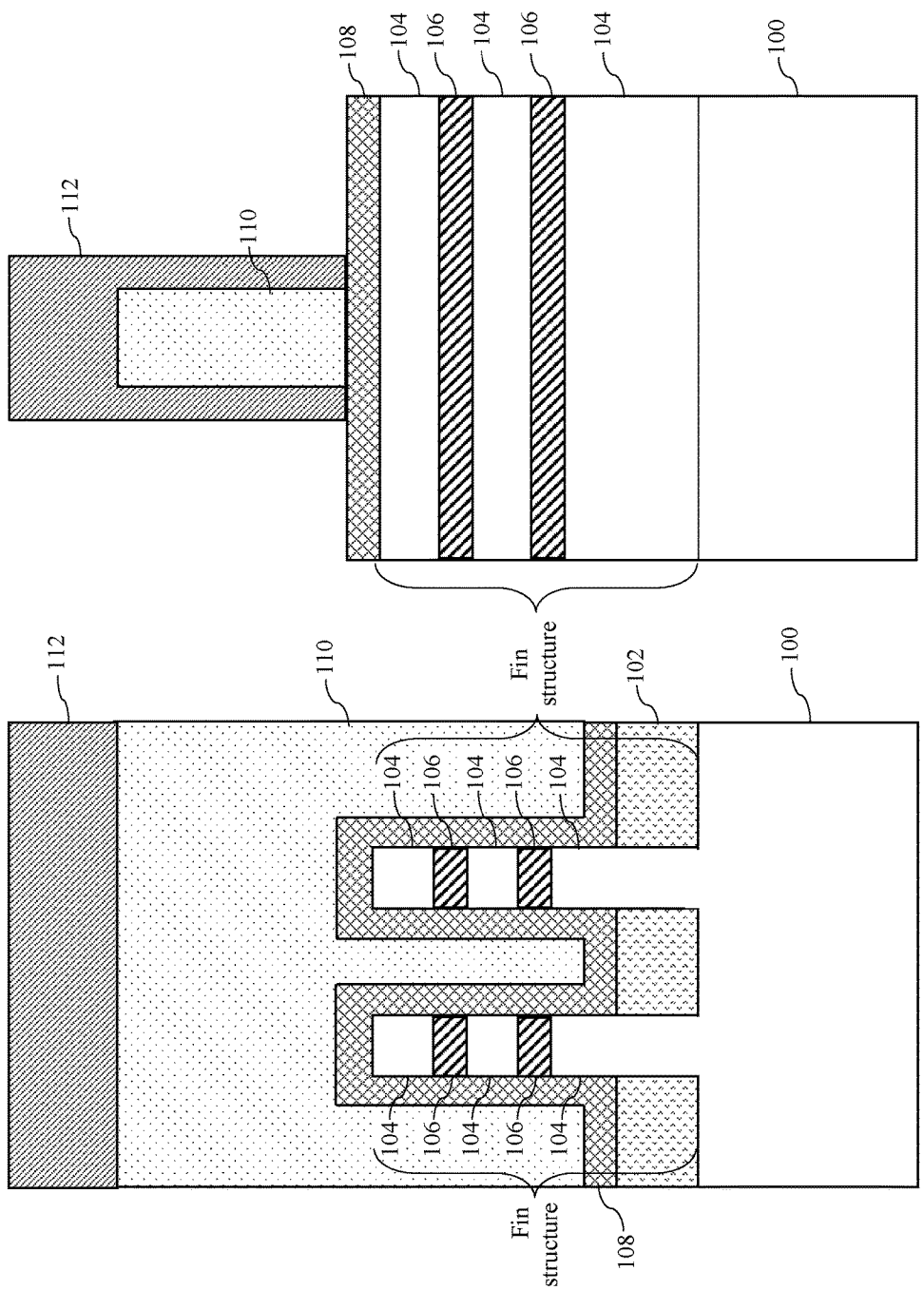

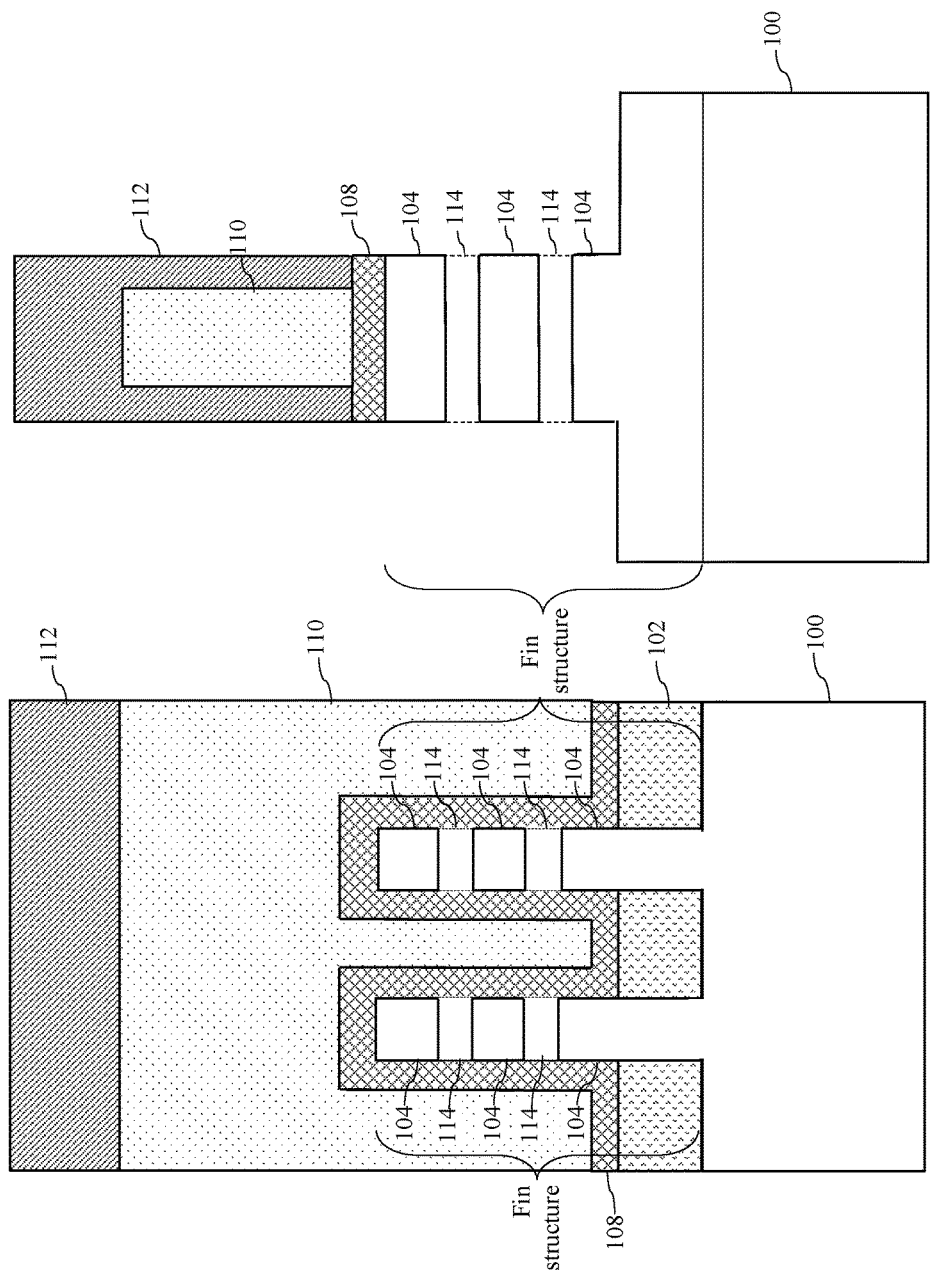

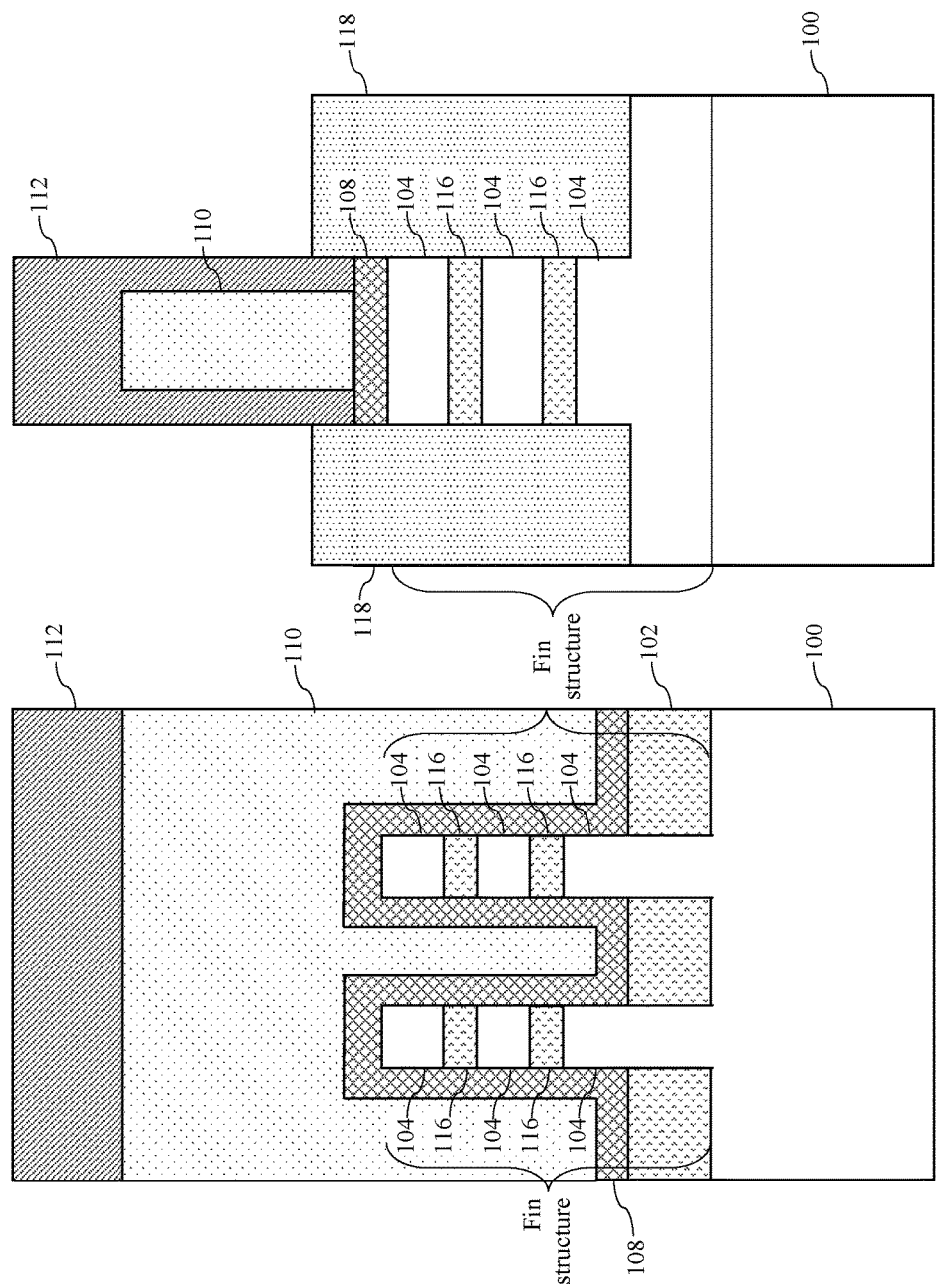

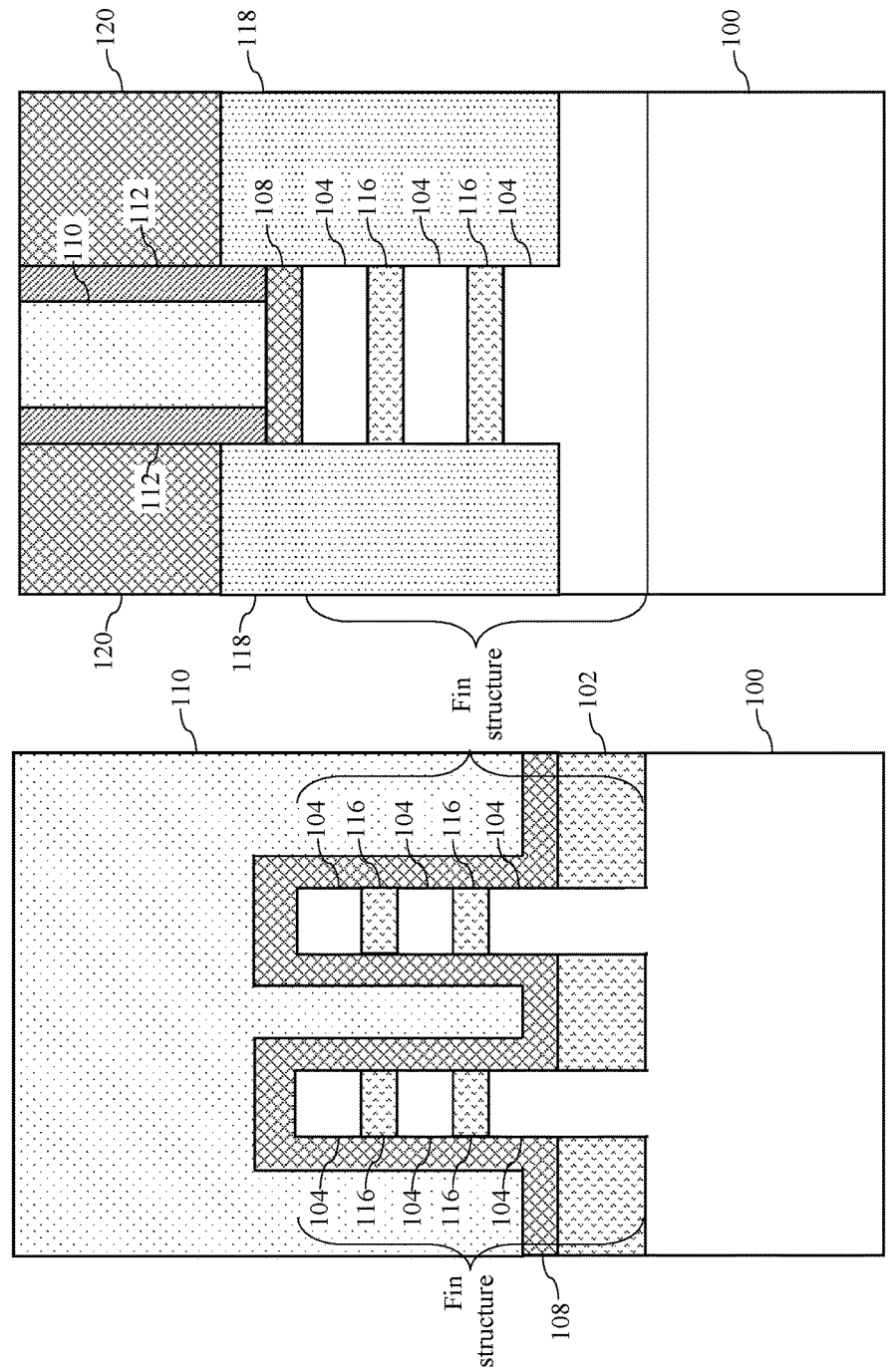

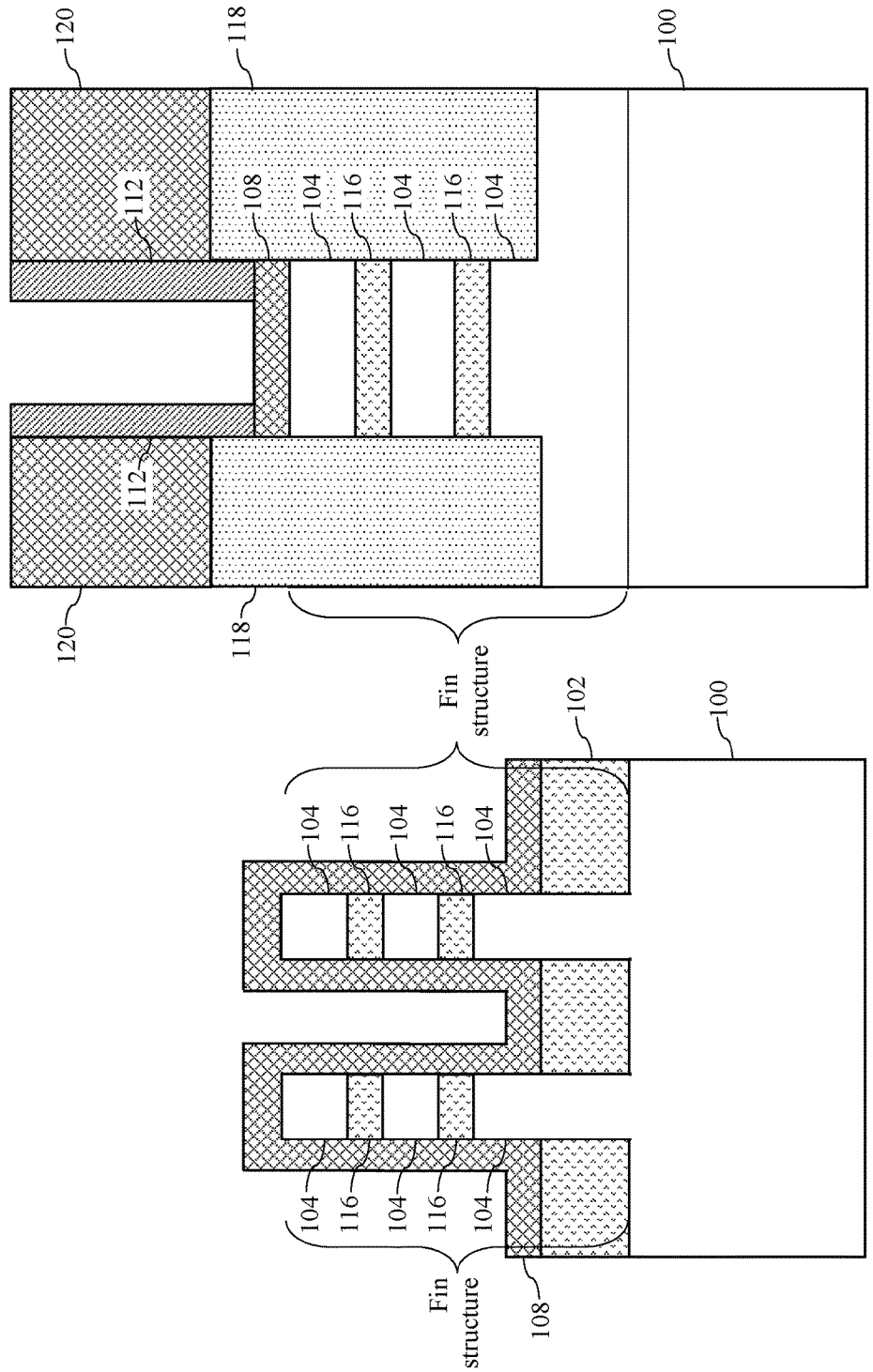

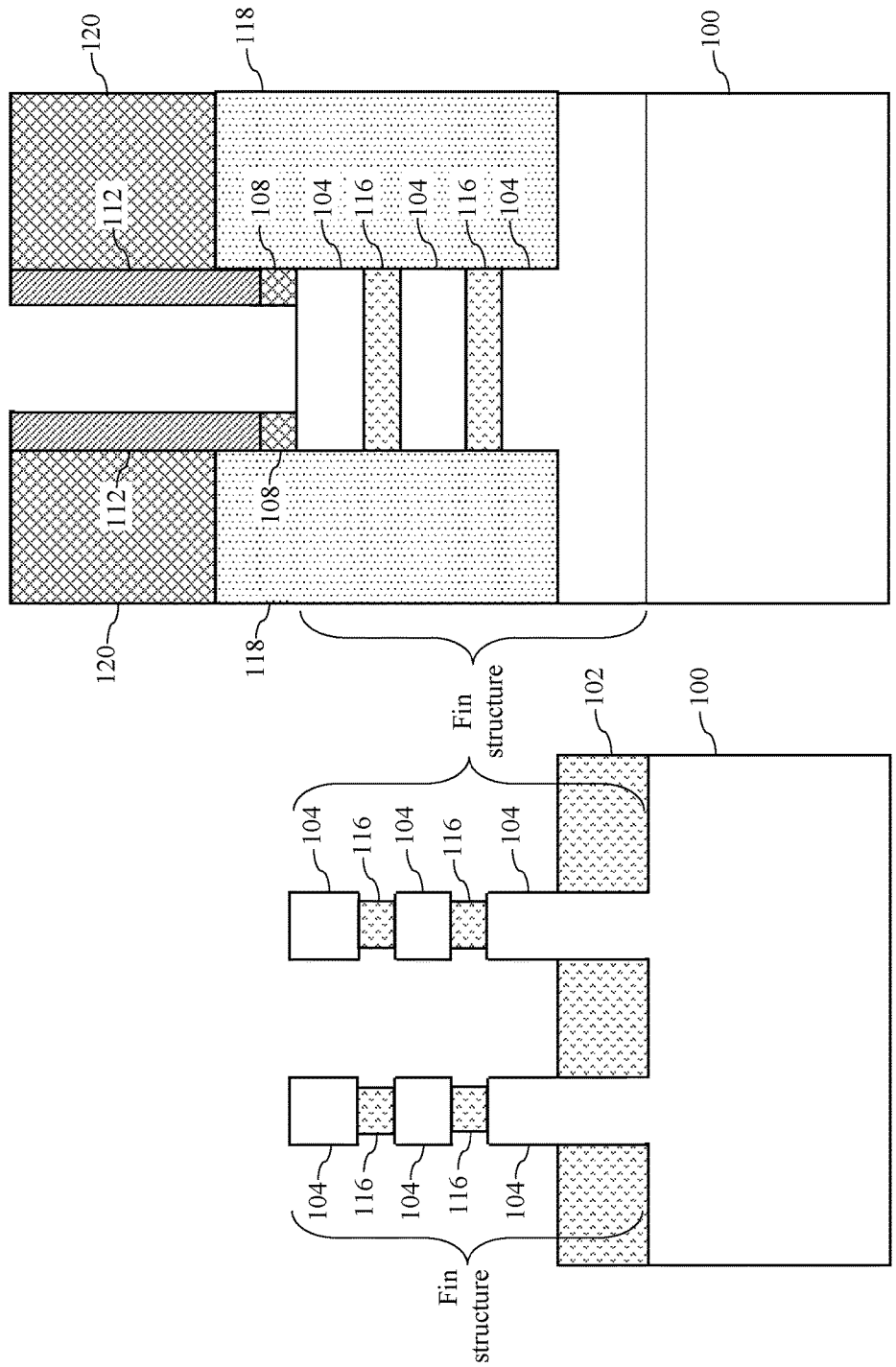

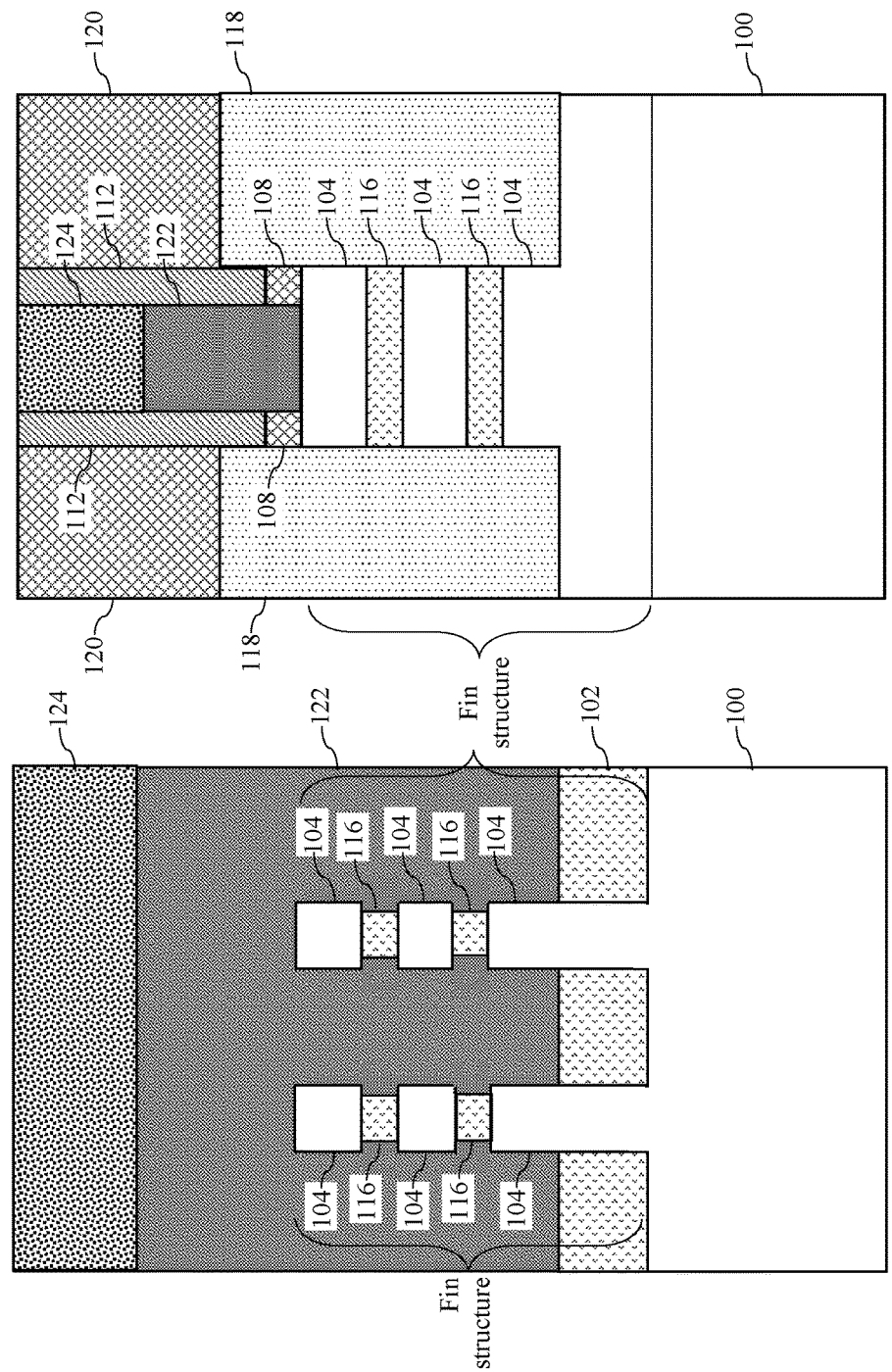

FINFET SEMICONDUCTOR DEVICE

TECHNICAL FIELD

The present invention relates generally to the field of MOSFET devices and, more particularly, to FinFET devices.

BACKGROUND

A FinFET is a type of multi-gate Metal Oxide Semiconductor Field Effect Transistor (MOSFET). A multi-gate transistor incorporates more than one gate into one single device. In FinFET, a thin silicon film wrapped over the conducting channel forms the body. The name has been derived from the fact that the structure, when viewed, looks like a set of fins. The thickness of the device determines the channel length of the device. The channel length of a MOSFET is the distance between the source and drain junctions. Since the fabrication of MOSFET, the channel length of the device has been shrinking constantly so as to fabricate compact and fast devices.

The main aim of the MOSFET is to control the flow of voltage and current between the source and drain terminals. A high quality capacitor is formed by the gate terminal. The gate is composed of the silicon oxide layer, the p-body silicon and gate metallization and the p-body silicon. This capacitor is the most vital part. The semiconductor surface at the below oxide layer is located between the source and drain terminal. This is inverted from p-type to n-type by applying a positive or negative gate voltage, respectively.

In current usage, the term FinFET refers to any fin-based, multigate transistor architecture. For example, FinFET may include double-gate development efforts.

SUMMARY

According to one embodiment of the present invention, a method for fabricating a semiconductor structure is provided. The method includes: forming a fin structure on a substrate by: forming a first fin layer on the substrate; forming a first insulator layer on the first fin layer; forming a second fin layer on the first insulator layer; forming a second insulator layer on the second fin layer; forming a third fin layer on the second insulator layer; and forming a gate structure on a plurality of opposing sides and a top surface of the fin structure.

According to another embodiment of the present invention, a semiconductor structure is provided. The semiconductor structure includes: a substrate; a fin structure, wherein the fin structure comprises: a first fin layer located on the substrate; a first insulator layer located on the first fin layer; a second fin layer located on the first insulator layer; a second insulator layer located on the second fin layer; and a third fin layer located on the second insulator layer; and a gate structure on a plurality of opposing sides and a top surface of the fin structure.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 1(a) depicts a cross-sectional view of a semiconductor device after a fabrication stage according to one or more embodiments of the present invention;

FIG. 1(b) depicts a cross-sectional view of the semiconductor device shown in FIG. 1(a), taken along axis A of an individual fin of the device after a fabrication stage according to one or more embodiments of the present invention;

FIG. 2(a) depicts a cross-sectional view of a semiconductor device after a fabrication stage according to one or more embodiments of the present invention;

FIG. 2(b) depicts a cross-sectional view of the semiconductor device shown in FIG. 2(a), taken along an individual fin of the device after a fabrication stage according to one or more embodiments of the present invention;

FIG. 4(a) depicts a cross-sectional view of a semiconductor device after a fabrication stage according to one or more embodiments of the present invention;

FIG. 4(b) depicts a cross-sectional view of the semiconductor device shown in FIG. 4(a), taken along an individual fin of the device after a fabrication stage according to one or more embodiments of the present invention;

FIG. 6(a) depicts a cross-sectional view of a semiconductor device after a fabrication stage according to one or more embodiments of the present invention;

FIG. 6(b) depicts a cross-sectional view of the semiconductor device shown in FIG. 6(a), taken along an individual fin of the device after a fabrication stage according to one or more embodiments of the present invention;

FIG. 7(a) depicts a cross-sectional view of a semiconductor device after a fabrication stage according to one or more embodiments of the present invention;

FIG. 7(b) depicts a cross-sectional view of the semiconductor device shown in FIG. 7(a), taken along an individual fin of the device after a fabrication stage according to one or more embodiments of the present invention;

FIG. 8(a) depicts a cross-sectional view of a semiconductor device after a fabrication stage according to one or more embodiments of the present invention;

FIG. 8(b) depicts a cross-sectional view of the semiconductor device shown in FIG. 8(a), taken along an individual fin of the device after a fabrication stage according to one or more embodiments of the present invention;

FIG. 9(a) depicts a cross-sectional view of a semiconductor device after a fabrication stage according to one or more embodiments of the present invention;

FIG. 9(b) depicts a cross-sectional view of the semiconductor device shown in FIG. 9(a), taken along an individual fin of the device after a fabrication stage according to one or more embodiments of the present invention;

FIG. 10(a) depicts a cross-sectional view of a semiconductor device after a fabrication stage according to one or more embodiments of the present invention; and FIG. 10(*b*) depicts a cross-sectional view of the semiconductor device shown in FIG. 10(*a*), taken along an individual fin of the device after a fabrication stage according to one or more embodiments of the present invention.

DETAILED DESCRIPTION

Figures 3A, 3B:
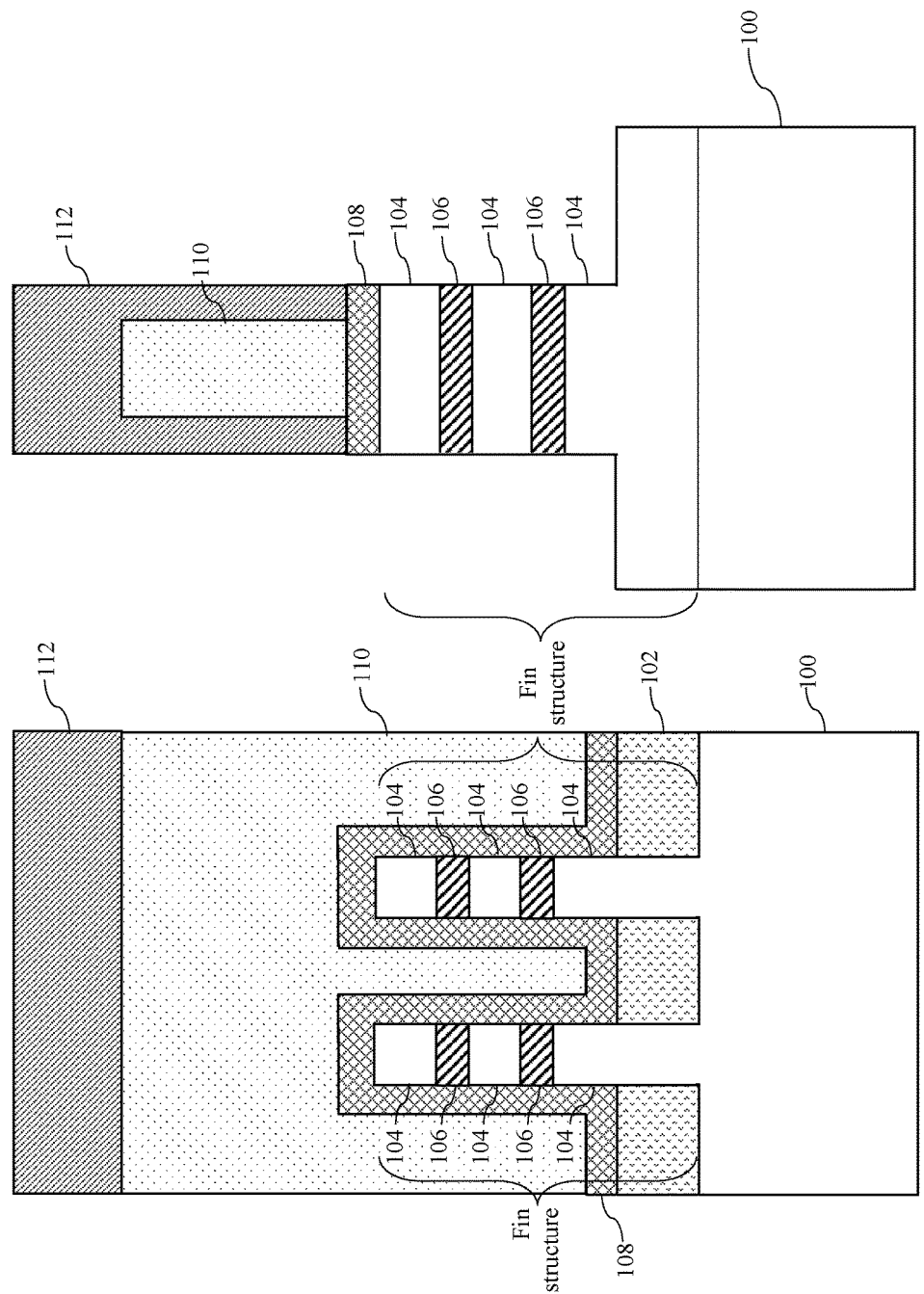
FIG. 3(a) depicts a cross-sectional view of a semiconductor device after a fabrication stage according to one or more embodiments of the present invention.
FIG. 3(b) depicts a cross-sectional view of the semiconductor device shown in FIG. 3(a), taken along an individual fin of the device after a fabrication stage according to one or more embodiments of the present invention.

Embodiments of the present invention recognize that traditional FinFET semiconductor devices can have short fin heights, but are limited in gate control. Nanowire and nanosheet based FinFET semiconductor devices allow for much better gate control, but require significantly higher fins due to the thickness requirements of the high-k metal gate fill. Furthermore, nanowire and nanosheet semiconductor devices have issues with high-k anneal reliability because the dummy silicon material can be difficult to remove between the nanowires and nanosheets. Also, nanowires and nanosheet semiconductor devices pose various fabrication process challenges.

Embodiments of the present invention provide a hybrid structure between a traditional FinFET device and a nanowire/nanosheet based FinFET device. In embodiments of the present invention, the insertion of a fin with multiple insulator layers allows for gate control better than that of a traditional FinFET device, while also allowing a fin height shorter than that of a nanowire/nanosheet FinFET device. Furthermore, fabrication of embodiments of the present invention do not pose the same process challenges as those seen in nanowire/nanosheet based FinFET devices.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various layers of the semiconductor substrate allows the conductivity of the substrate to be changed with the application of voltage. By creating structures of these various components, millions of transistors can be built and wired together to form the complex circuitry of a modern microelectronic device.

Embodiments of the present invention will now be described in detail with reference to the Figures. FIG. 1(*a*) is a cross-sectional view of a semiconductor device after a fabrication stage according to one or more embodiments of the present invention. FIG. 1(*a*) includes substrate layer 100, shallow trench isolation layer 102, fin layers 104 and insulator layers 106 inserted into the fin structure during fabrication. FIG. 1(*b*) is a cross-sectional view of the semiconductor device shown in FIG. 1(*a*), taken along axis A of an individual fin of the device after a fabrication stage according to one or more embodiments of the present invention. In FIG. 1(*b*), only substrate layer 100, fin layers 104 and insulator layers 106 inserted into the fin structure can be seen since shallow trench isolation layer 102 is deposited between the fin structures. For clarity of illustration, axis A is not indicated in FIG. 2(*a*), 3(*a*), 4(*a*), 5(*a*), 6(*a*), 7(*a*), 8(*a*), 9(*a*), or 10(*a*). However, the cross-sectional views of FIG. 2(*b*), 3(*b*), 4(*b*), 5(*b*), 6(*b*), 7(*b*), 8(*b*), 9(*b*), or 10(*b*) are also along axis A.

In various embodiments of the present invention, substrate layer 100 is formed using a material such as silicon (Si) and can range in thickness from about 100 μm to 1 mm. Shallow trench isolation layer 102 can be formed using a material such as silicon dioxide ($SiO_2$) or any other suitable material known to one of ordinary skill in the art. Shallow trench isolation layer 102 can be deposited at a thickness between about 100 nm and 150 nm. The fin structure is formed by alternating deposition of fin layers 104 and insulator layers 106. The fin structure is initially formed using a material such as silicon germanium (SiGe) for the insulator layers 106 at a thickness of about 3 nm to 5 nm per insulator region and a material such as silicon (Si) for the fin layers 104. According to various embodiments of the present invention, the insulator layers are much thinner than that of nanowire/nanosheet insulator layers, which are at least 10 nm. Therefore, the present invention can achieve at least a 10 nm reduction in fin height being from about 40 nm to 60 nm, whereas in nanowire/nanosheet based semiconductors the fin height is from about 50 nm to 70 nm.

FIG. 2(a) is a cross-sectional view of a semiconductor device after a fabrication stage according to one or more embodiments of the present invention. In this fabrication stage, dielectric layer 108 is deposited directly onto the shallow trench isolation layer 102 and on a plurality of opposing sides and the tops of the fin structures. The dielectric layer 108 can be formed using a material such as silicon dioxide (SiO$_2$) and deposited at a thickness from about 1 nm to 3 nm. Thereafter, dummy gate 110 is formed along a length of the semiconductor device using a material such as amorphous silicon (a-Si) having a width from about 15 nm to 20 nm and a thickness from about 200 nm to 300 nm. Spacer 112 is formed on the top and around dummy gate 110 using a material such as silicon nitride (SiN) at a thickness from about 50 nm to 60 nm. FIG. 2(b) is a cross-sectional view of the semiconductor device shown in FIG. 2(a), taken along an individual fin of the device after a fabrication stage according to one or more embodiments of the present invention. Here, dielectric layer 108 is shown to cover an entire width of the fin structure. Furthermore, spacer 112 is shown encapsulating the top and sides of dummy gate 110. Taken together, dielectric layer 108, dummy gate 110 and spacer 112 form a gate structure.

FIG. 3(a) is a cross-sectional view of a semiconductor device after a fabrication stage according to one or more embodiments of the present invention. In this fabrication stage, FIG. 3(a) looks identical to FIG. 2(a) due to the cross-section being taken along the length of the semiconductor device. FIG. 3(b) is a cross-sectional view of the semiconductor device taken along an individual fin. In this fabrication stage, a standard dry etch technique such as reactive ion etching is used to remove portions of the fin structure that are not below spacer 112 down to the same height as the adjacent shallow trench isolation layer 102. The resulting width of the fin structure is reduced to be the same as the width of the gate structure.

FIG. 4(a) is a cross-sectional view of a semiconductor device after a fabrication stage according to one or more embodiments of the present invention and FIG. 4(b) is a cross-sectional view of the semiconductor device of FIG. 4(a) taken along an individual fin. In this fabrication stage, the insulator layers 106 are removed using a wet etch process leaving cavities 114 in the fin structure. As can be seen in FIG. 4(a), the cavities 114 are defined by dielectric layer 108 and fin layers 104.

Figures 5A, 5B:
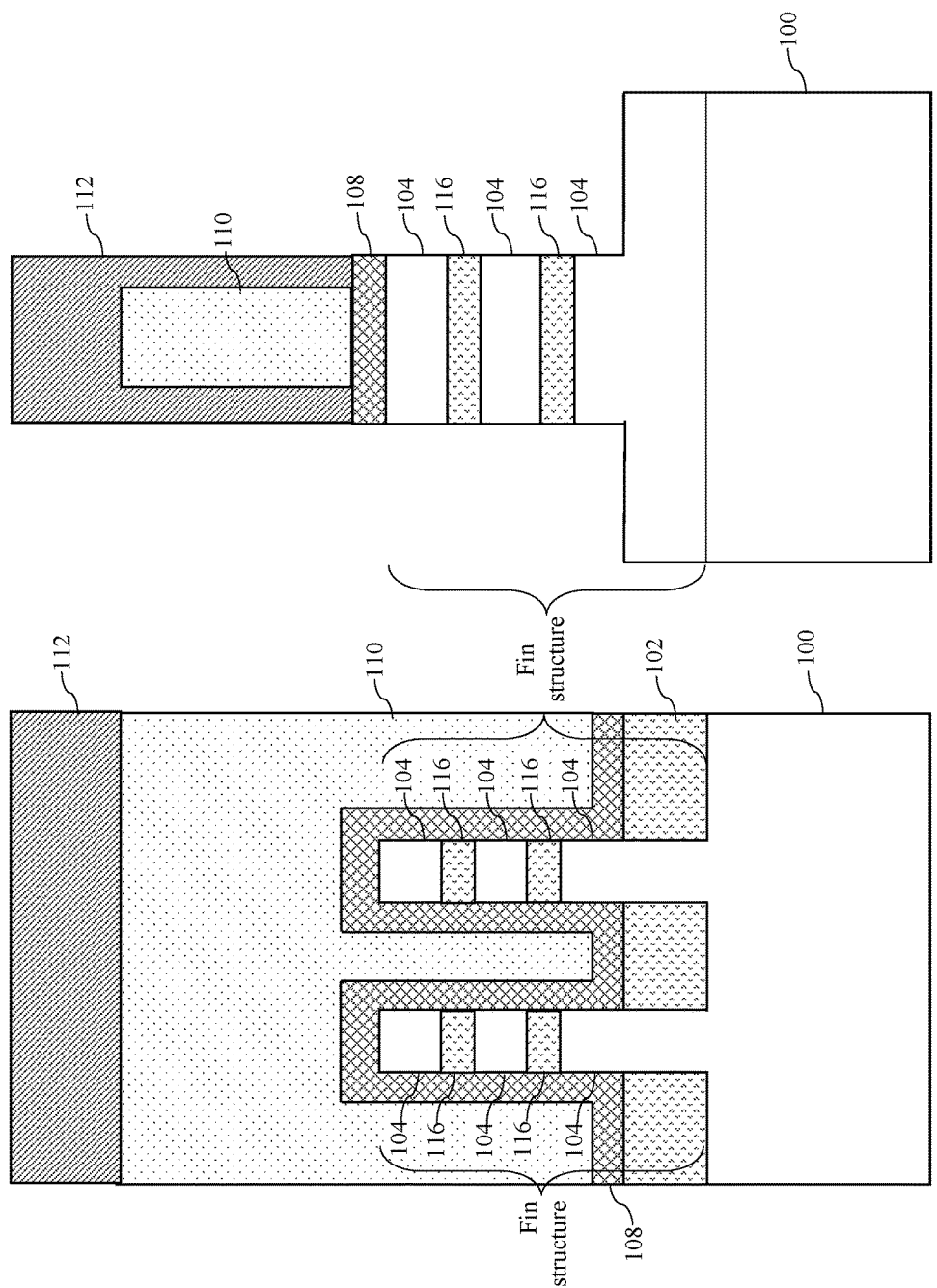
FIG. 5(a) depicts a cross-sectional view of a semiconductor device after a fabrication stage according to one or more embodiments of the present invention.
FIG. 5(b) depicts a cross-sectional view of the semiconductor device shown in FIG. 5(a), taken along an individual fin of the device after a fabrication stage according to one or more embodiments of the present invention.

FIG. 5(a) is a cross-sectional view of a semiconductor device after a fabrication stage according to one or more embodiments of the present invention and FIG. 5(b) is a cross-sectional view of the semiconductor device of FIG. 5(a) taken along an individual fin. In this fabrication stage, insulator layers 116 are deposited via a process such as atomic layer deposition into the cavities 114 (FIGS. 4(a), 4(b)) using materials such as silicon dioxide (SiO$_2$), silicon oxynitride (SiON), or silicon nitride (SiN) at the same thickness as the previous insulator layers 106. Excess deposited material of insulator layers 116 is then etched back using a dry etch process such as reactive ion etching such that the length of insulator layers 116 is substantially equal to the length of fin layers 104. After this stage, newly deposited insulator layers 116 and fin layers 104 comprise the fin structure.

FIG. 6(a) is a cross-sectional view of a semiconductor device after a fabrication stage according to one or more embodiments of the present invention. In this fabrication stage, FIG. 6(a) looks identical to FIG. 5(a) due to the cross-section being taken along the length of the semiconductor device. FIG. 6(b) is a cross-sectional view of the semiconductor device taken along an individual fin. In this fabrication stage, epitaxial layers 118 are deposited on the sides of the fin structure at a thickness from about 55 nm to 75 nm. Epitaxial layers 118 directly contact fin layers 104, insulator layers 116, dielectric layer 108 and the lower portion of spacer 112. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

FIG. 7(a) is a cross-sectional view of a semiconductor device after a fabrication stage according to one or more embodiments of the present invention. At this stage, spacer 112 from the previous figures is polished down until a top surface of dummy gate 110 is exposed using a process such as chemical mechanical polishing (CMP). FIG. 7(b) is a cross-sectional view of the semiconductor device shown in FIG. 7(a), taken along an individual fin of the device after a fabrication stage according to one or more embodiments of the present invention. In FIG. 7(b), it can further be seen that spacer 112 is polished down to expose a top surface of dummy gate 110, although it should be noted that spacer 112 is still present in the semiconductor device on opposing sides of dummy gate 110. Furthermore, at this stage, dielectric interlayers 120 are deposited directly onto epitaxial layers 118 and directly contact spacer 112, such that a top surface of dielectric interlayers 120 is flush with the top surface of dummy gate 110.

FIG. 8(a) is a cross-sectional view of a semiconductor device after a fabrication stage according to one or more embodiments of the present invention and FIG. 8(b) is a cross-sectional view of the semiconductor device of FIG. 8(a) taken along an individual fin. At this stage in the fabrication process, dummy gate 110 is removed using a combination of dry and wet etch techniques.

FIG. 9(a) is a cross-sectional view of a semiconductor device after a fabrication stage according to one or more embodiments of the present invention and FIG. 9(b) is a cross-sectional view of the semiconductor device of FIG. 9(a) taken along an individual fin. In this fabrication stage, a portion of dielectric 108 that was below dummy gate 100 is removed from a plurality of opposing sides and the top of the fin structure. Removal of dielectric layer 108 can be done using a wet etch process. It is important to note that during the wet etch process, over-etch occurs resulting in small portions of the opposing sides of the insulator layers 116 being removed creating a pullback where the length of the insulator layers 116 becomes less than the length of the fin layers 104. At this stage in the fabrication process, a high-k preclean is performed in preparation for high-k material deposition.

FIG. 10(a) is a cross-sectional view of a semiconductor device after a fabrication stage according to one or more embodiments of the present invention. FIG. 10(a) shows the completed device structure according to one or more embodiments of the present invention. In this fabrication stage, high-k dielectric metal gate 122 is deposited directly onto shallow trench isolation layer 102 and a plurality of opposing sides and the top of the fin structure. High-k dielectric metal gate 122 directly contacts fin layers 104 and insulator layers 116. High-k dielectric metal gate can be deposited using materials such as hafnium oxide (HfO2), aluminum oxide (AlO2), or zirconium oxide (ZrO2) through atomic layer deposition or similar techniques known in the art. Thereafter, sacrificial align contract 124 can be deposited directly onto high-k dielectric metal gate 122 using a material such as tungsten (W). FIG. 10(*b*) is a cross-sectional view of the semiconductor device shown in FIG. 10(*a*), taken along an individual fin of the device. In this fabrication stage, it is shown that high-k dielectric metal gate 122 is in direct contact with the fin structure in the area where dummy gate 110 was previously located and the remaining dielectric layer 108. Furthermore, high-k dielectric metal gate 122 and sacrificial align contact 124 are encapsulated on opposing sides by spacer 112.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor structure, comprising:
    forming a fin structure on a substrate by:
        forming a first fin layer located on the substrate;
        forming a first insulator layer on the first fin layer;
        forming a second fin layer on the first insulator layer;
        forming a second insulator layer on the second fin layer; and
        forming a third fin layer on the second insulator layer; and
    forming a gate structure on a plurality of opposing sides and a top surface of the fin structure, wherein forming the gate structure includes:
        forming a shallow trench isolation layer directly on the substrate on either side of the fin structure;
        forming a dielectric layer located on the shallow trench isolation layer and surrounding the fin structure;
        forming a dummy gate located on the dielectric layer;
        forming a spacer on the dummy gate;
    dry etching portions of the fin structure that are not below the spacer down to the same height as the shallow trench isolation layer;
        removing the first and second insulator layers to form a first cavity and a second cavity via a wet-etch process; and
        depositing via atomic layer deposition a first replacement insulator layer into the first cavity and a second replacement insulator layer into the second cavity.

2. The method of claim 1, wherein forming the gate structure further comprises: forming an epitaxy on either side of the gate structure;
    forming an interlayer dielectric layer on the epitaxy on either side of the gate structure; polishing away the spacer down to the dummy gate via chemical mechanical polishing;
    removing the dummy gate by performing wet and dry etch techniques; removing the dielectric layer along the length of the gate using a wet etch technique; performing a high-k pre-clean;
    depositing a high-k metal gate material along the length of the gate; and
depositing a sacrificial align contact onto the high-k metal gate material along the length of the gate.

3. The method of claim 2, wherein, after removing the dielectric layer, the insulator layers have a width less than a width of the fin layers.

* * * * *